US012716931B2

(12) United States Patent
Zhang et al.

(10) Patent No.: US 12,716,931 B2
(45) **Date of Patent: *Aug. 25, 2026**

(54) INSULATION DETECTION METHOD AND APPARATUS FOR CONVERSION SYSTEM

(71) Applicant: Delta Electronics (Shanghai) Co., Ltd., Shanghai (CN)

(72) Inventors: Dehui Zhang, Shanghai (CN); Teng Liu, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 232 days.

This patent is subject to a terminal disclaimer.

(21) Appl. No.: 18/493,820

(22) Filed: Oct. 25, 2023

(65) Prior Publication Data

US 2024/0230746 A1 Jul. 11, 2024

(30) Foreign Application Priority Data

Jan. 10, 2023 (CN) ........................ 202310033235.X

(51) Int. Cl.
*G01R 31/62* (2020.01)
*G01R 31/12* (2020.01)

(52) U.S. Cl.
CPC ......... *G01R 31/1272* (2013.01); *G01R 31/62* (2020.01)

(58) Field of Classification Search
CPC .... G01R 31/62; G01R 31/1272; G01R 31/42; G01R 31/52; G01R 31/12; H02M 1/00; H02M 5/00; H02M 7/00
See application file for complete search history.

(56) References Cited

U.S. PATENT DOCUMENTS 5,574,320 A * 11/1996 Shirai .................. H01H 47/002 307/131
2008/0278980 A1* 11/2008 Lu ....................... H02M 7/5387 363/71
2021/0021196 A1* 1/2021 Satake .............. H02M 3/33515
2024/0136846 A1* 4/2024 Choi ......................... H02J 7/06

FOREIGN PATENT DOCUMENTS

CN 110907781 B 1/2021
JP 2017227465 A * 12/2017

* cited by examiner

*Primary Examiner* — Lee E Rodak
*Assistant Examiner* — Demetrius R Pretlow
(74) *Attorney, Agent, or Firm* — CKC & Partners Co., LLC

(57) ABSTRACT

The application discloses an insulation detection method and apparatus for a conversion system, the conversion system including: a converter module including n conversion units, where n≥1, each of the n conversion units including a transformer including a primary winding and a secondary winding; and a connection element connected between the primary winding and the secondary winding of the transformer; the insulation detection method including: controlling at least one switch of the converter module to turn on; detecting signals that reflect a current flowing through the connection element; and processing the signal and outputting insulation information, wherein the insulation information represents an insulation state of the conversion system.

23 Claims, 14 Drawing Sheets detecting signals that reflect a current flowing through the connection element 14 processing the signals that reflect the current flowing through the connection element 14 and outputting insulation information, wherein the insulation information represents an insulation state of the conversion system

INSULATION DETECTION METHOD AND APPARATUS FOR CONVERSION SYSTEM

CROSS-REFERENCE TO RELATED APPLICATIONS

This non-provisional application claims priority under 35 U.S.C. § 119(a) on patent application Ser. No. 20/231,0033235. X filed in P.R. China on Jan. 10, 2023, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

BACKGROUND OF THE APPLICATION

1. Field of the Application

The application relates to the field of power electronic devices, and in particular, to an insulation detection method and apparatus for a conversion system.

2. Related Art

Power transformers in medium-high voltage and high-frequency isolation converters, which act as an important component of electrical isolation between high and low voltage circuits, shall bear a working voltage for a long time and an overvoltage stress in faulty conditions. With development of the converter system towards a direction of high frequency, high voltage and high power density, a volume of the isolation transformer is decreased, and the main insulation structure between primary and secondary sides of the isolation transformer shall bear a higher electric field stress. The higher the electric field stress is, the higher a risk of insulation failure will be, thereby causing serious accidents, and loss of life and property.

At an initial stage of insulation failure, detection signal is quite weak. In the actual insulation detection for the medium-high voltage converter, in order to avoid interference brought by operation of the converter, insulation detection is performed when the converter is in standby mode. During detection, pulse signals that reflect insulation conditions will pass through high impedance elements such as switches that are turned off in the converter system, such that an impedance of the insulation detection circuit is high, and the collected signals are further weakened. Therefore, the signals that truly reflect the insulation conditions are hardly to be identified, thereby causing great reduction in detection reliability.

SUMMARY OF THE APPLICATION

An object of the application is to provide an insulation detection method and apparatus for a conversion system, which turn on switches in the detection circuit, thereby reducing an impedance of the detection circuit, and enhancing an intensity of the insulation signals.

In order to achieve the object, the application provides an insulation detection method for a conversion system, the conversion system including: a converter module including n conversion units, where n≥1, each of the n conversion units including a transformer including a primary winding and a secondary winding; and a connection element connected between the primary winding and the secondary winding of the transformer; the insulation detection method including: turning on at least one switch of the converter module; detecting signals that reflect a current flowing through the connection element; and processing the signals and outputting insulation information, wherein the insulation information represents an insulation state of the conversion system.

According to one embodiment of the application, the conversion system includes an excitation source electrically connected to the primary winding of the transformer or connected in series with the connection element, the excitation source including at least one of: a power generating device; a battery; a DC power grid; an AC power grid; a capacitor with charge; and a converter module.

According to one embodiment of the application, the conversion system further includes a first controllable switch connected in series with the connection element, and the insulation detection method further includes: turning on the first controllable switch.

According to one embodiment of the application, the conversion system further includes a coupling impedance network connected in series with the connection element and including at least one of a resistor, an inductor and a capacitor.

According to one embodiment of the application, each of the n conversion units includes a DC/AC converter or a AC/AC converter electrically connected to the primary winding of the transformer, and the at least one switch is in the DC/AC converters or the AC/AC converters of the n conversion units.

According to one embodiment of the application, each of the n conversion units includes a AC/DC converter or a AC/AC converter electrically connected to the secondary winding of the transformer, and the at least one switch is in the AC/DC converters or the AC/AC converters of the n conversion units.

According to one embodiment of the application, each of the n conversion units includes a bridge arm, and the at least one switch is in the bridge arms of the n conversion units.

According to one embodiment of the application, each of the n conversion units has a first port and a second port, the first ports of the n conversion units are connected in series or in parallel, and the second ports of the n conversion units are connected in series or in parallel, where n≥2.

According to one embodiment of the application, each of the n conversion units has a first port and a second port, and includes a first bypass switch connected in parallel to the second port, the second ports of the n conversion units are connected in series, where n≥2, and at least one switch of the converter module includes the first bypass switch.

According to one embodiment of the application, the switch is a semiconductor switch or a mechanical switch or a breaker or a contactor or a relay.

According to one embodiment of the application, the conversion system further includes an insulation detection unit for detecting signals that reflect a current flowing through the connection element.

The application further provides an insulation detection apparatus for a conversion system, the conversion system including: a converter module including n conversion units, where n≥1, each of the n conversion units including a transformer including a primary winding and a secondary winding; and a connection element connected between the primary winding and the secondary winding of the transformer; the insulation detection apparatus including: a control unit connected to the converter module for controlling at least one switch of the converter module to be turned on; a first insulation detection unit sleeved onto the connection element and connected to the control unit for detecting signals that reflect a current flowing through the connection element; and a processing unit connected to the first insulation detection unit for processing the signals and outputting insulation information, wherein the insulation information represents an insulation state of the conversion system.

According to one embodiment of the application, the conversion system includes an excitation source electrically connected to the primary winding of the transformer or connected in series to the connection element, the excitation source including at least one of: a power generating device; a battery; a DC power grid; an AC power grid; a capacitor with charge; and a converter module.

According to one embodiment of the application, the conversion system further includes a first controllable switch connected in series with the connection element.

According to one embodiment of the application, the conversion system further includes a coupling impedance network connected in series with the connection element and including at least one of a resistor, an inductor and a capacitor.

According to one embodiment of the application, each of the n conversion units includes a DC/AC converter or a AC/AC converter electrically connected to the primary winding of the transformer, and the at least one switch is in the DC/AC converters or the AC/AC converters of the n conversion units.

According to one embodiment of the application, each of the n conversion units includes a AC/DC converter or a AC/AC converter electrically connected to the secondary winding of the transformer, and the at least one switch is in the AC/DC converters or the AC/AC converters of the n conversion units.

According to one embodiment of the application, each of the n conversion units includes a bridge arm, and the at least one switch is in the bridge arms of the n conversion units.

According to one embodiment of the application, each of the n conversion units has a first port and a second port, the first ports of the n conversion units are connected in series or in parallel, and the second ports of the n conversion units are connected in series or in parallel, where n≥2.

According to one embodiment of the application, each of the n conversion units has a first port and a second port, and includes a first bypass switch connected in parallel to the second port, the second ports of the n conversion units are connected in series, where n≥2, and at least one switch of the converter module includes the first bypass switch.

According to one embodiment of the application, the switch is a semiconductor switch or a mechanical switch or a breaker or a contactor or a relay.

According to one embodiment of the application, the conversion system further includes a second insulation detection unit for detecting signals that reflect a current flowing through the connection element.

The application provides a power conversion circuit and a power source apparatus, which can obviously reduce loss and a volume of the common mode inductor without influence on filtering performance of the electromagnetic interference, thereby improving a power density and efficiency of the power source apparatus with large power.

BRIEF DESCRIPTION OF THE DRAWINGS

To clearly explain the technical solution implemented by the application, hereinafter the appended drawings used in the embodiments are simply introduced.

The additional aspects and advantages of the present application are partially explained in the below description, and partially becoming apparent from the description, or may be obtained through the practice of the application.

DETAILED EMBODIMENTS OF THE APPLICATION

Now the referred drawings describe exemplary embodiments more comprehensively. However, the exemplary embodiments can be implemented in various forms, and shall not be understood to be limited to the described embodiments. On the contrary, providing these embodiments makes the application comprehensive and complete, and concept of the exemplary embodiments is fully and completely conveyed to those skilled in the art.

Figure 1:
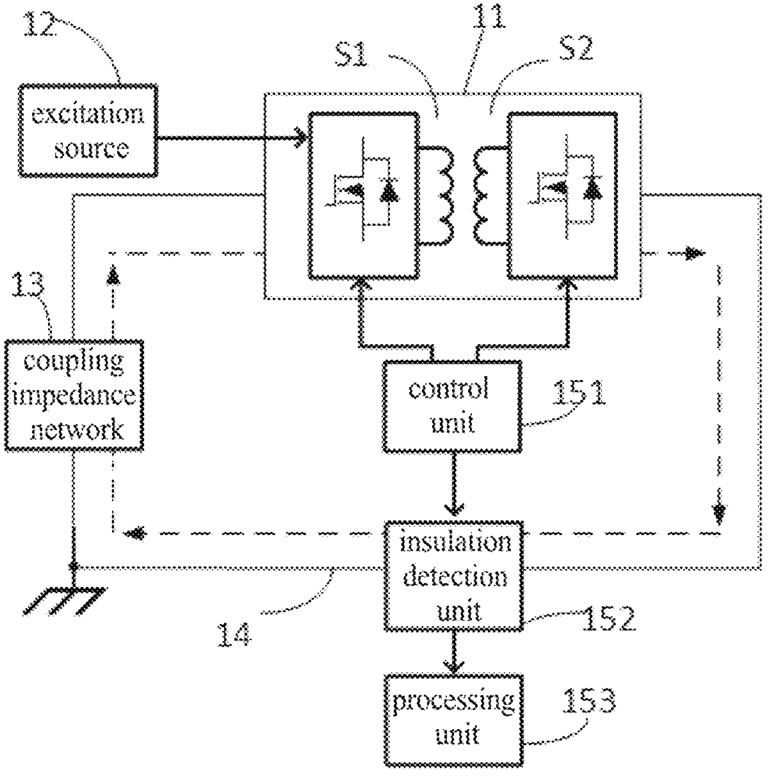
FIG. 1 is a schematic diagram of an insulation detection apparatus for a conversion system provided in one embodiment of the application.

FIG. 1 is a schematic diagram of an insulation detection apparatus for a conversion system provided in one embodiment of the application. As shown in FIG. 1, the embodiment of the application provides an insulation detection apparatus for a conversion system. The illustrated conversion system including a converter module 11, an excitation source 12, a coupling impedance network 13 and a connection element 14. The converter module 11 includes n conversion units, where n≥1, and each conversion unit includes a transformer including a primary winding S1 and a secondary winding S2. The excitation source 12 is electrically connected to the primary winding S1 of the transformer. The connection element 14 is connected between the primary winding S1 and the secondary winding S2 of the transformer. The coupling impedance network 13 is connected in series to the connection element 14. The converter module 11, the coupling impedance network 13 and the connection element 14 in the conversion system are connected in series to form an insulation detection circuit where a ground terminal is connected. In some embodiments, the coupling impedance network 13 includes at least one of a resistor, an inductor and a capacitor, the excitation source 12 may be, for example, a power generating device, a battery, a DC power grid, an AC power grid, a capacitor with charge or a converter module, and the excitation source 12 may also be connected in series to the connection element 14. In some embodiments, the coupling impedance network 13 may not exist. In some embodiments, the ground terminal may also not be directly connected to the insulation detection circuit. In some embodiments, the transformer is a high-frequency transformer, and a magnetic core is preferably made of amorphous body or nanocrystalline or ferrite.

The insulation detection apparatus includes a control unit 151, an insulation detection unit 152 and a processing unit 153. The control unit 151 is connected to the converter module 11 for controlling at least one switch of the converter module 11 to turn on. The switch can be a semiconductor switch or a mechanical switch or a breaker or a contactor or a relay. The insulation detection unit 152 is configured for detecting signals that reflect a current flowing through the connection element 14, and is connected to the control unit 151. The insulation detection unit 152 can be connected in series to the connection element 14 for detecting a current flowing through the connection element 14. The insulation detection unit 152 can also detect a magnetic field generated by the connection element 14, and the magnetic field can also reflect a magnitude of the current flowing through the connection element 14. More specifically, the magnetic field can be detected using the antenna method. The insulation detection unit 152 can be a current transformer, a Hall sensor, a sampling resistor or an ultra high frequency sensor. The processing unit 153 is connected to the insulation detection unit 152 for processing the signals detected by the insulation detection unit 152, and outputting insulation information, and the insulation information represents an insulation state of the conversion system. The insulation state includes whether the transformer has partial discharge and a magnitude of insulation resistance. Therefore, the detection method of the application can detect whether partial discharge occurs, and can also detect a magnitude of insulation impedance. Specifically, in detection of partial discharge, the control unit determines the degree of insulation damage of the transformer based on a magnitude of partial discharge, and then makes response to insulation protection.

Figure 2:
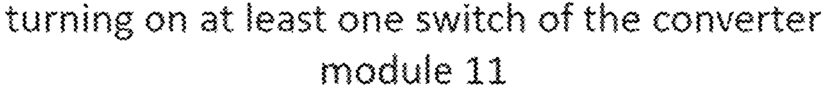
FIG. 2 is a flow diagram of an insulation detection method for a conversion system provided in one embodiment of the application.

FIG. 2 is a flow diagram of an insulation detection method for a conversion system provided in one embodiment of the application. Referring to FIGS. 1 and 2, the embodiment of the application provides an insulation detection method for a conversion system shown in FIG. 1. The insulation detection method includes:

turning on at least one switch of the converter module 11;

detecting signals that reflect a current flowing through the connection element 14; and processing the signals that reflect the current flowing through the connection element 14 and outputting insulation information, wherein the insulation information represents an insulation state of the conversion system.

Figure 3:
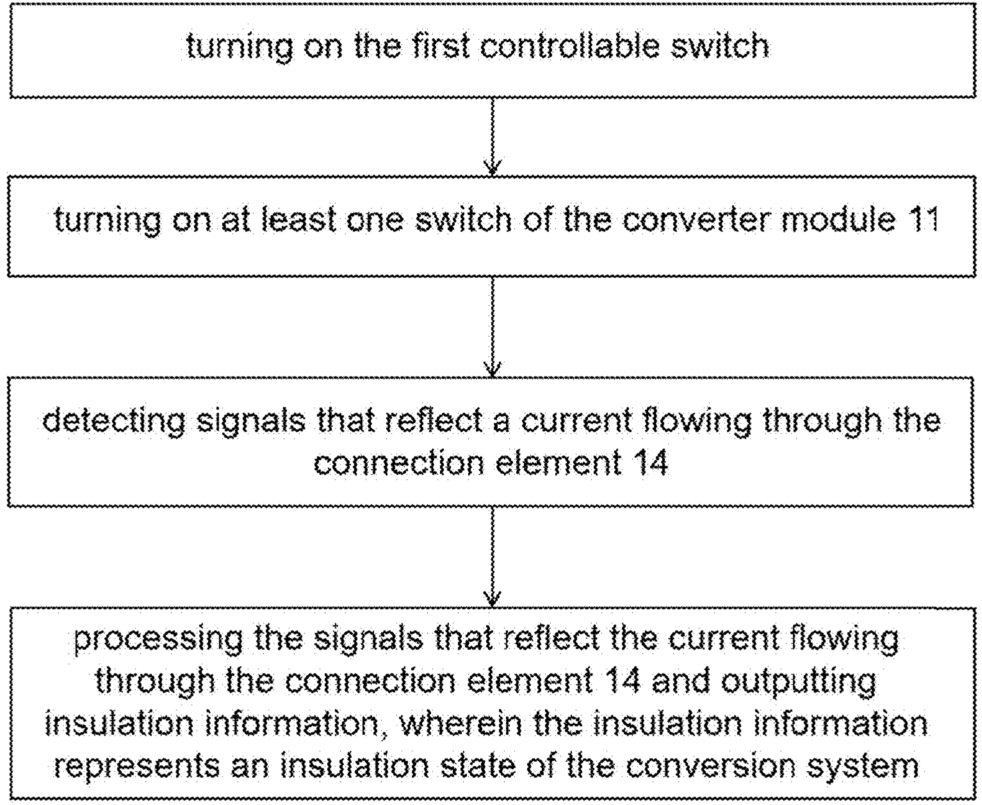
FIG. 3 is a flow diagram of an insulation detection method for a conversion system provided in another embodiment of the application.

FIG. 3 is a flow diagram of an insulation detection method for a conversion system provided in another embodiment of the application. Referring to FIGS. 1 and 3, in the embodiment of another detection method of the application, the conversion system further includes a first controllable switch (not shown in FIG. 1) connected in series with the connection element 14, and before turning on at least one switch of the converter module 11, the insulation detection method further includes:

turning on the first controllable switch.

After the conversion system performs insulation detection using the insulation detection method of the application, the processing unit 152 outputs the insulation information to the control unit 151, and when the insulation information is greater than a set value, the control unit 151 controls to start insulation protection, thereby avoiding accidents caused due to insulation failure.

By forming a low impedance detection circuit by turning on the switches of the converter module in the insulation detection system of the conventional medium-high voltage converter, an intensity of the insulation detection signals sampled by the insulation detection unit is enhanced, and sensitivity and reliability of the insulation detection apparatus are improved. Therefore, the detection method can be widely applied to insulation monitoring of the multi-switch cascaded medium-high voltage isolation converter without adding additional components. And the detection method is easy to implement with a low cost.

Figure 4:
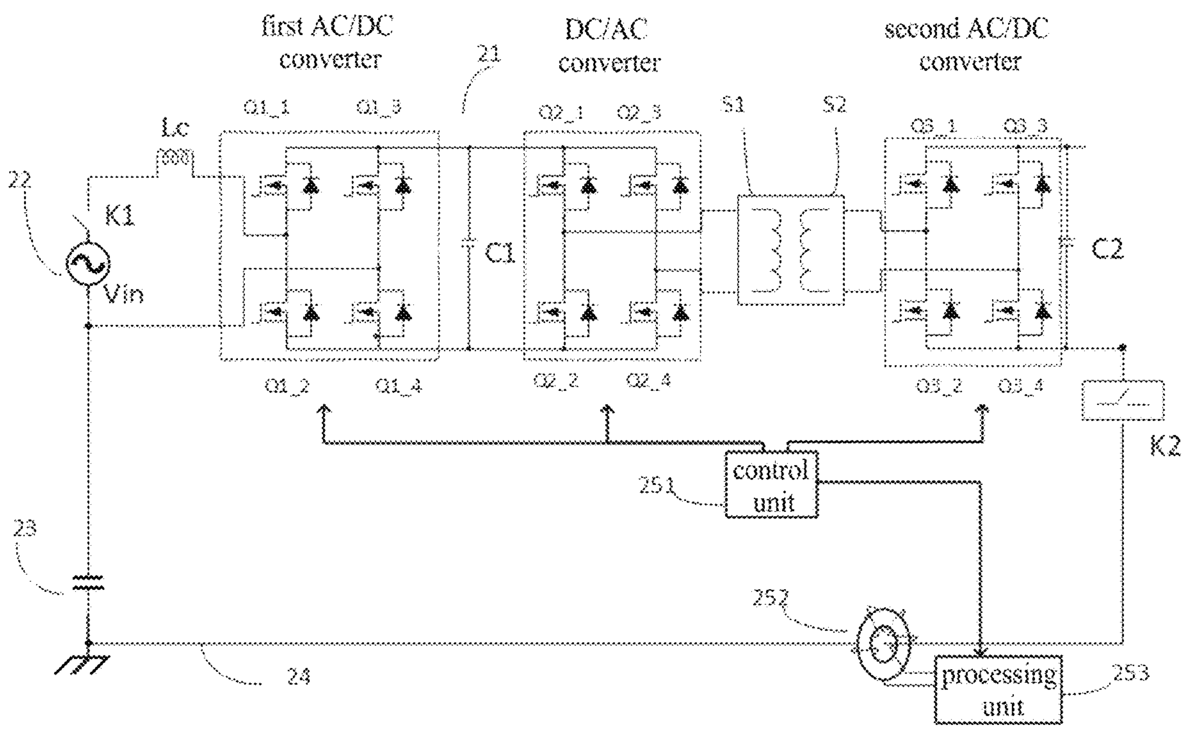
FIG. 4 is a schematic diagram of an insulation detection apparatus for a conversion system provided in a first embodiment of the application.

FIG. 4 is a schematic diagram of an insulation detection apparatus for a conversion system provided in a first embodiment of the application. As shown in FIG. 4, the conversion system includes a converter module, an excitation source 22 (such as, an AC power source Vin), a coupling impedance network 23 (such as, a capacitor), a connection element 24, a first controllable switch K1 and a second controllable switch K2. The converter module has a first port and a second port. In this embodiment, the first port of the converter module is connected to the excitation source 22, and the second port of the converter module is connected to a load (not shown). In some other embodiments, the second port of the converter module is connected to the excitation source 22, and the first port of the converter module is connected to a load. The converter module includes a conversion unit 21, and the conversion unit 21 includes a transformer including a primary winding S1 and a secondary winding S2. In this embodiment, the conversion unit 21 includes a first AC/DC converter (including switches Q1_1, Q1_2, Q1_3 and Q1_4), a DC/AC converter (including switches Q2_1, Q2_2, Q2_3 and Q2_4) and a second AC/DC converter (including switches Q3_1, Q3_2, Q3_3 and Q3_4). The first AC/DC converter, the DC/AC converter and the primary winding S1 of the transformer are electrically connected sequentially. The DC/AC converter, the transformer and the second AC/DC converter form a DC/DC converter. An input port of the DC/AC converter is connected in parallel with a DC capacitor C1. The second AC/DC converter is electrically connected to the secondary winding S2 of the transformer. The connection element 24 is connected between the primary winding S1 and the secondary winding S2 of the transformer, and more specifically, connected between the first port and the second port of the converter module. The coupling impedance network 23, the second controllable switch K2 and the connection element 24 are connected in series. In this embodiment, the ground terminal is connected to the capacitor (the coupling impedance network 23). In some other embodiments, the ground terminal can also be directly connected to the first port or the second port of the converter module without passing the capacitor. In some embodiments, the coupling impedance network 23 can include a capacitor and a resistor. In some embodiments, the coupling impedance network 23 can use a ground coupling capacitor or a DC bus capacitor without additionally adding the impedance network. In some embodiments, the primary winding S1 of the converter module can be electrically connected to a first AC/AC converter, and the secondary winding S2 of the converter module can be electrically connected to a second AC/AC converter.

The insulation detection apparatus includes a control unit 251, an insulation detection unit 252 and a processing unit 253. The control unit 251, the insulation detection unit 252 and the processing unit 253 have the same structure and function as that shown in FIG. 1, so the details are not described here.

In this embodiment, a current transformer is used in the insulation detection unit 252. In some embodiments, a sampling resistor or a Hall sensor is used in the insulation detection unit 252. In some other embodiments, an ultra high frequency sensor is used in the insulation detection unit 252. The frequency range of the ultra high frequency sensor is preferably from 200 MHz to 1500 MHz, and the ultra high frequency sensor is placed near the converter system for detecting electromagnetic signals generated by partial discharge of the transformer.

A detection method used by the insulation detection apparatus for the conversion system provided in the first embodiment of the application includes:

- when the conversion system is power off and in standby mode, turning on the first controllable switch K1, using the AC power source Vin to pre-charge the DC capacitor C1, and turning off K1 when a voltage of the DC capacitor C1 reaches a preset value. In some embodiments, before start of insulation detection, the voltage of the DC capacitor C1 has been greater than the preset value. For example, when the conversion system is just switched from a running state to a shutdown state, the voltage of the DC capacitor C1 is still greater than the preset value, so it is unnecessary to pre-charge.

The control unit 251 turns on Q1_1, Q1_4, Q2_1, Q2_3, Q3_1, Q3_3 or Q1_1, Q1_4, Q2_1, Q2_3, Q3_2, Q3_4 in the converter module, so as to apply voltage between primary winding S1 and secondary winding S2. Specifically, the control unit 251 turns on and off the switches in the converter module through PWM control. The switch may be MOSFET, IGBT, IGCT, or the like. Under normal temperature condition, when a switch is turned off, an impedance of it is greater than 100 kΩ, and when turned on, the impedance of it is less than 1Ω, so turning on the switches in the converter module can reduce the impedance of the insulation detection circuit.

The second controllable switch K2 is turned on to form a low impedance detection circuit, and the insulation detection unit 252 detects signal that reflects a current flowing through the connection element 24. In this embodiment, the signal that reflects the current flowing through the connection element 24 can be obtained by detecting a current, an electric field or a magnetic field of the connection element 24 or the converter module. Specifically, the current flowing through the connection element 24 can also be detected For example, the partial discharge current flowing through the converter module also finally passes the connection element 24.

The processing unit 253 processes the signals that reflect a current flowing through the connection element 24 and outputs insulation information, and the insulation information represents an insulation state of the conversion system.

Figure 5:
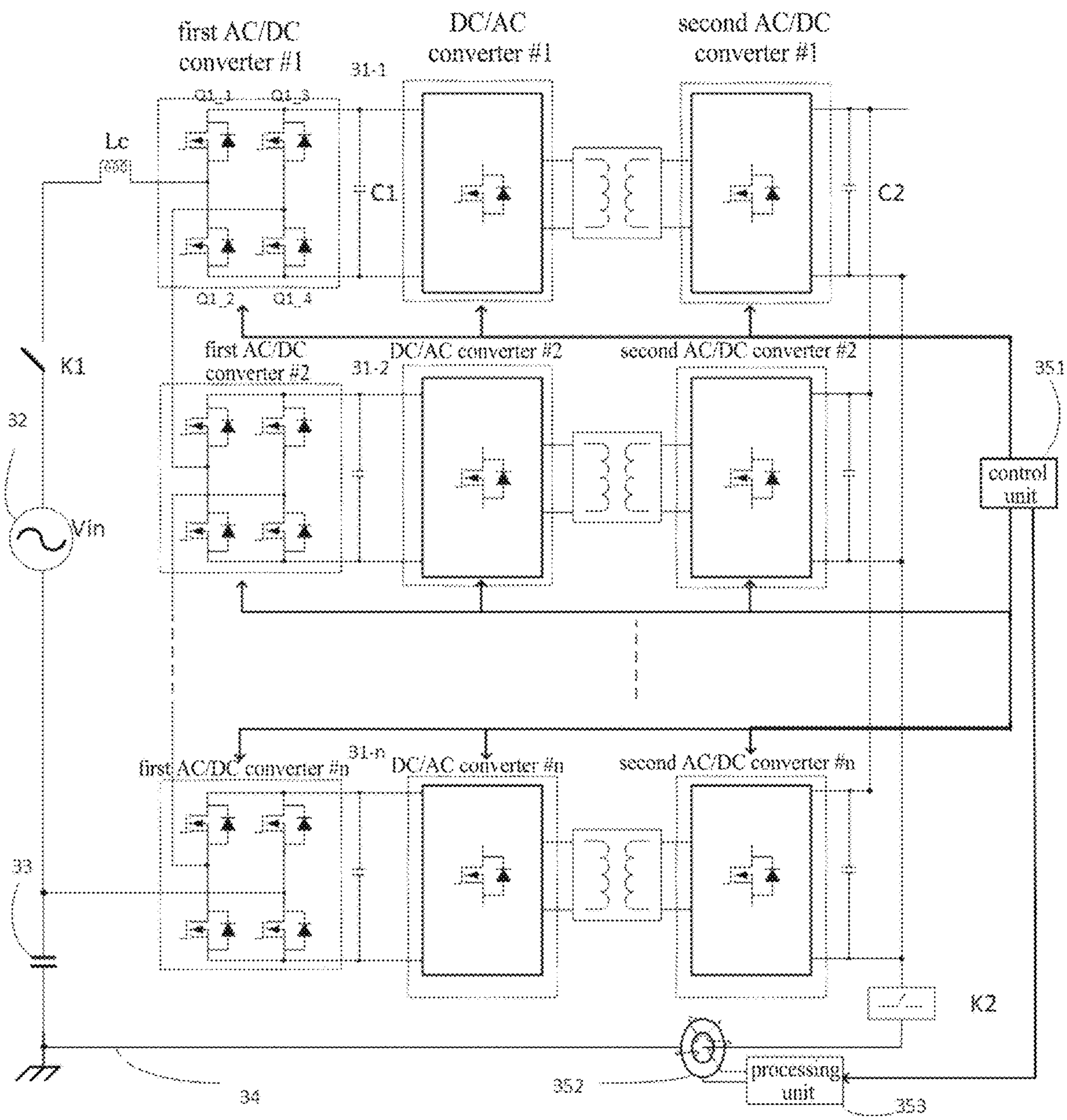
FIG. 5 is a schematic diagram of an insulation detection apparatus for a conversion system provided in a second embodiment of the application.

FIG. 5 is a schematic diagram of an insulation detection apparatus for a conversion system provided in a second embodiment of the application. As shown in FIG. 5, the application provides an insulation detection apparatus for a conversion system, and the illustrated conversion system includes a converter module, an excitation source 32 (such as, an AC power source Vin), a coupling impedance network 33, a connection element 34, a first controllable switch K1 and a second controllable switch K2. The converter module includes n conversion units 31-1, 31-2 to 31-*n*, where n≥2, and each conversion unit has a first port and a second port. The first ports of the n conversion units are connected in series, and the second ports are connected in parallel. Each conversion unit includes a transformer including a primary winding S1 and a secondary winding S2. Taking the conversion unit 31-1 for example, the conversion unit 31-1 includes a first AC/DC converter (including switches Q1_1, Q1_2, Q1_3 and Q1_4), a DC/AC converter, a transformer and a second AC/DC converter electrically connected sequentially. The DC/AC converter, the transformer and the second AC/DC converter form a DC/DC converter.

The insulation detection apparatus includes a control unit 351, an insulation detection unit 352 and a processing unit 353. The control unit 351, the insulation detection unit 352 and the processing unit 353 are completely the same as that shown in FIG. 4, so the details are not described here. A detection method used by the insulation detection apparatus for the conversion system provided in the second embodiment of the application includes:

- when the conversion system is powered off and in standby mode, turning on the first controllable switch K1, using the AC power source Vin to pre-charge the DC capacitor C1, and turning off K1 when a voltage of the DC capacitor C1 reaches a preset value. In some embodiments, before start of insulation detection, the voltage of the DC capacitor C1 has been greater than the preset value. For example, when the conversion system is just switched from a running state to a shutdown state, the voltage of the DC capacitor C1 is still greater than the preset value, so it is unnecessary to pre-charge;
- the control unit 351 turns on the switches Q1_1 and Q1_4 of the first AC/DC converter in the n conversion units, and turns on an upper switch of the DC/AC converter and an upper switch or a lower switch of the second AC/DC converter in the n conversion units, so as to apply excitation to the transformers; turning on the second controllable switch K2 to form a low impedance detection circuit, and the insulation detection unit 352 detects signals that reflect a current flowing through the connection element 34;

the processing unit 353 processes the signals that reflect the current flowing through the connection element 34 and outputs insulation information, and the insulation information represents an insulation state of the conversion system.

Figure 6:
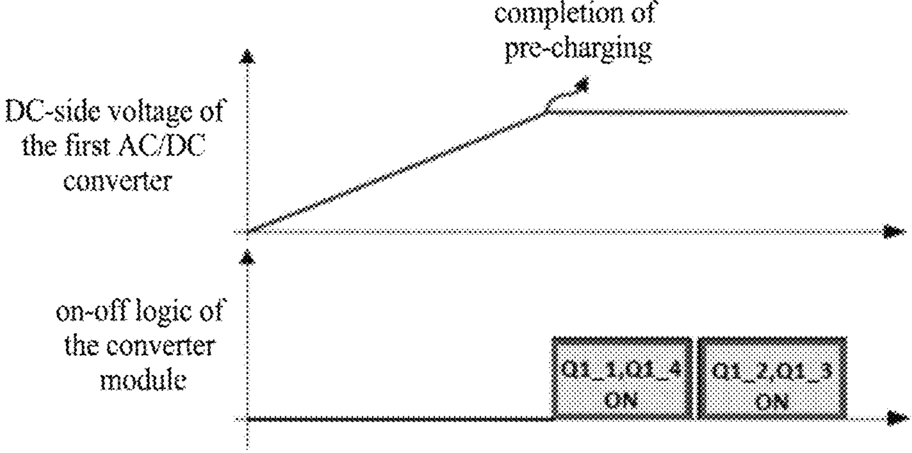
FIG. 6 is a schematic diagram of on logic of one switch of the insulation detection apparatus for the conversion system provided in the second embodiment of the application.

In other embodiments, after pre-charging the DC capacitor C1 is completed, the control unit 351 turns on the switches Q1_2 and Q1_3 of the first AC/DC converter in the n conversion units, or turns on Q1_2, Q1_3 and Q1_1, Q1_4 alternatively, such that the capacitors can be connected in series, and the insulation state of the transformer in all conversion units can also be detected. The on-off logic for the switches is shown in FIG. 6. Since interference signals are generated at the moment when the switches are switched from an off state to an on state or from an on state to an off state, in order to avoid influence of the interference signals on insulation detection, in some embodiments, the control unit 351 shields the insulation detection signals at the moment when the switches are switched, and makes response to the insulation detection signals when the switches are stably open or closed.

Figure 7:
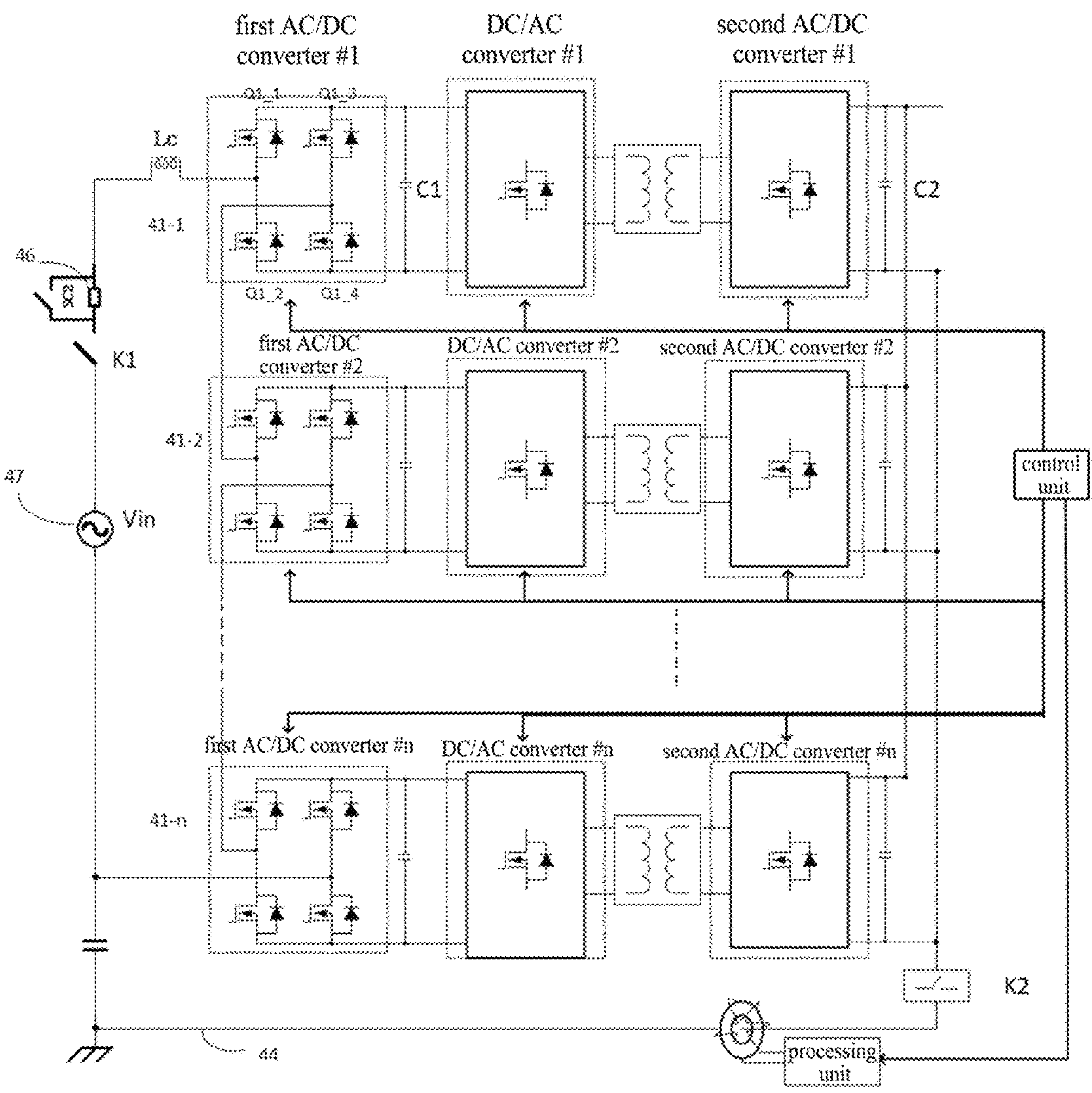
FIG. 7 is a schematic diagram of an insulation detection apparatus for a conversion system provided in a third embodiment of the application.

FIG. 7 is a schematic diagram of an insulation detection apparatus for a conversion system provided in a third embodiment of the application. As shown in FIG. 7, structure of the insulation detection apparatus for the conversion system provided in the third embodiment differs from that of the second embodiment in that in this embodiment, the conversion system further includes a pre-charging resistor 46. The pre-charging resistor 46 is connected in series with an excitation source 47, the excitation source 47 pre-charges the capacitor C1 through the pre-charging resistor 46, and during pre-charging, partial discharge insulation detection is performed. In this embodiment, the excitation source 47 is an AC power grid.

Figure 8:
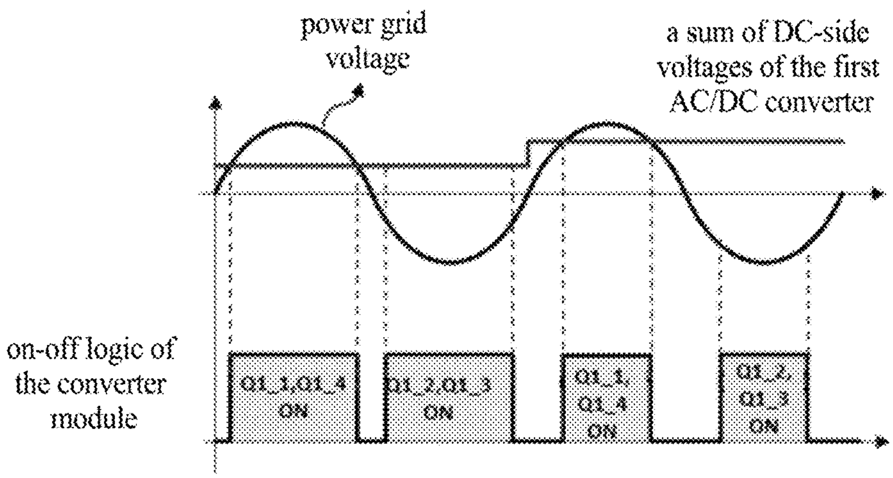
FIG. 8 is a schematic diagram of on logic of one switch of the insulation detection apparatus for the conversion system provided in the third embodiment of the application.
Figure 9:
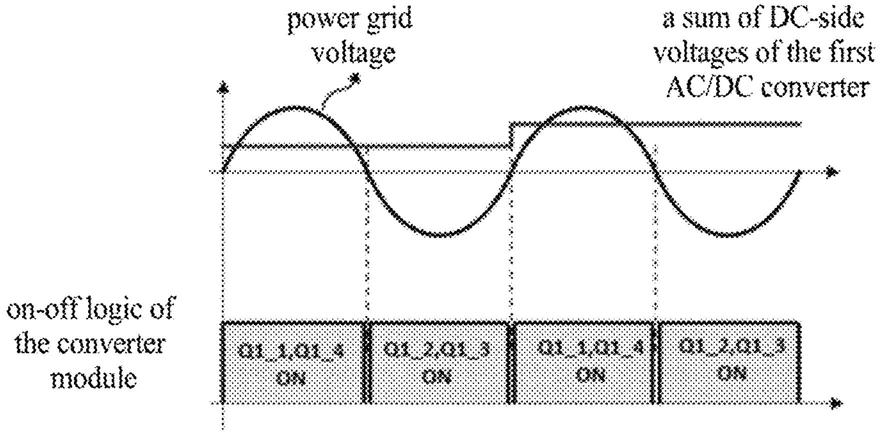
FIG. 9 is a schematic diagram of on logic of another switch of the insulation detection apparatus for the conversion system provided in the third embodiment of the application.

FIGS. 8 and 9 are diagrams of on-off logic of switches of the converter module in the third embodiment. As shown in FIG. 8, during pre-charging, the switches Q1_2, Q1_3 and the switches Q1_1, Q1_4 of the first AC/DC converter of the n conversion units 41-1, 41-2 to 41-*n* are alternatively turned on using synchronous rectification. The switches Q1_1, Q1_4 are turned on or off when a voltage of the AC power grid 47 is equal to a sum of DC-side voltages of the first AC/DC converter of the n conversion units. As shown in FIG. 9, during pre-charging, the switches Q1_2, Q1_3 and the switches Q1_1, Q1_4 of the first AC/DC converter of the n conversion units are alternatively turned on according to different voltage polarities of the AC power grid 47. A switching point of turning on the switches is only associated with the voltage polarities of the power grid voltage 47, when the voltage polarity of the power grid is positive, the switches Q1_1 and Q1_4 are turned on, and when the voltage polarity of the power grid is negative, the switches Q1_2 and Q1_3 are turned on.

Figure 10:
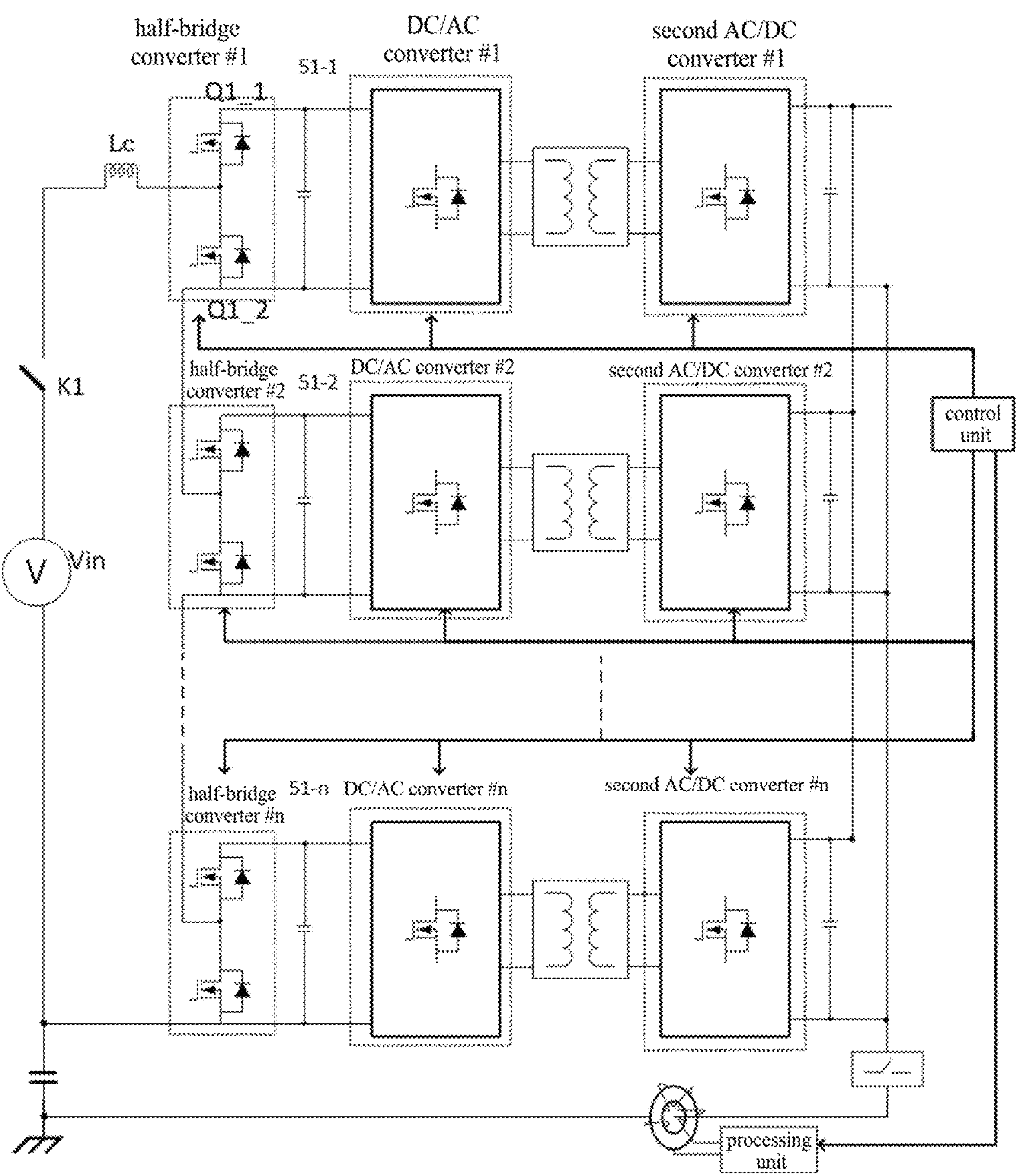
FIG. 10 is a schematic diagram of an insulation detection apparatus for a conversion system provided in a fourth embodiment of the application.

FIG. 10 is a schematic diagram of an insulation detection apparatus for a conversion system provided in a fourth embodiment of the application. As shown in FIG. 10, structure of the insulation detection apparatus for the conversion system provided in the fourth embodiment differs from that of the second embodiment in that the first AC/DC converter in FIG. 7 is replaced by a half-bridge converter (including switches Q1_1 and Q1_2), and the AC excitation source Vin in FIG. 7 is replaced by a DC excitation source Vin. After completion of pre-charging, Q1_1 or Q1_2 in each half-bridge converter is controlled to turn on. When Q1_1 in each half-bridge converter is turned on, the converter module achieves series connection of the capacitors. The upper switch of the DC/AC converter and the upper switch or the lower switch of the second AC/DC converter in the n conversion units are turned on, so as to apply excitation to the transformer of the n conversion units.

Figure 11:
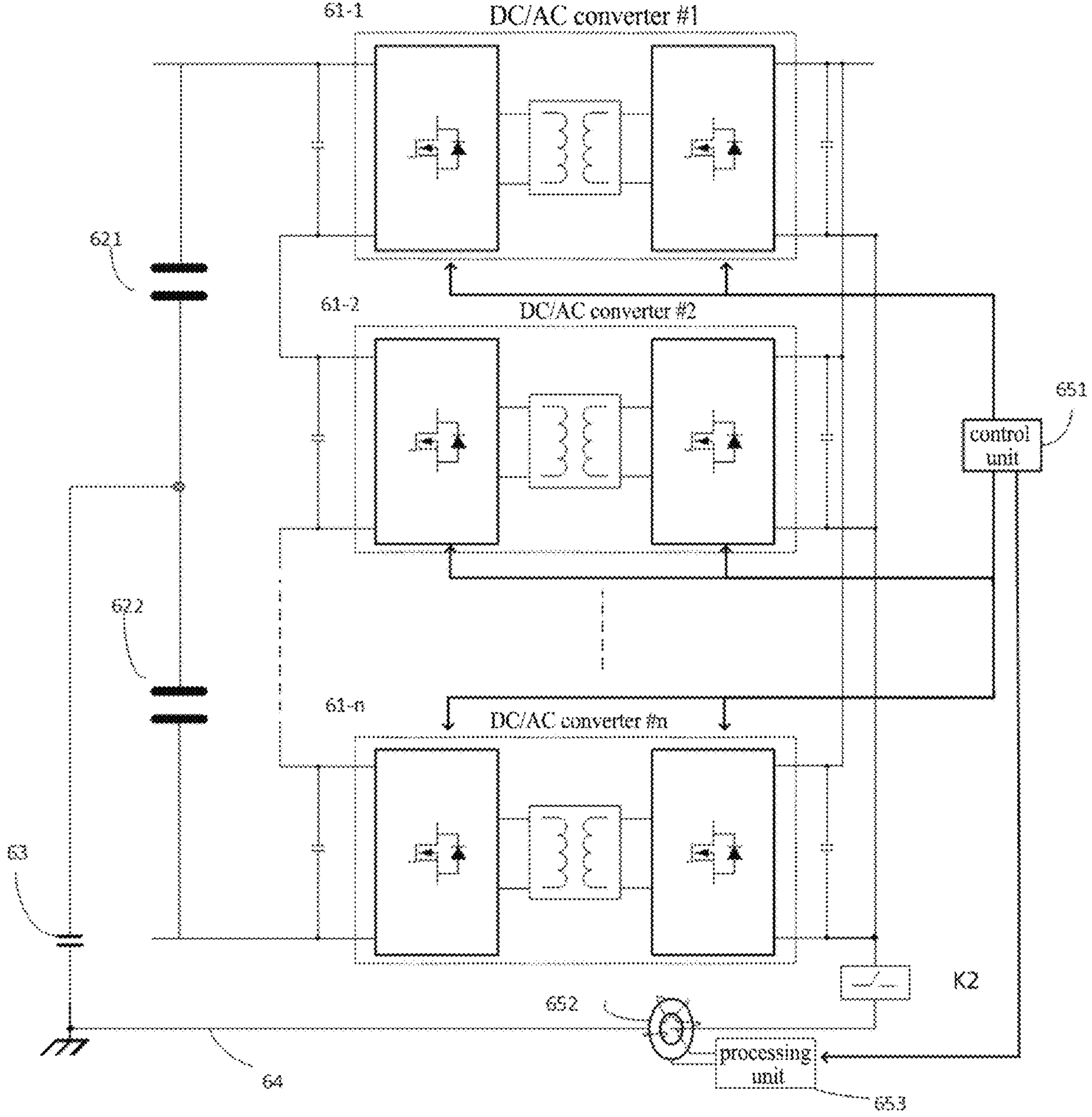
FIGS. 11 and 12 are schematic diagrams of an insulation detection apparatus for a conversion system provided in a fifth embodiment of the application.
Figure 12:
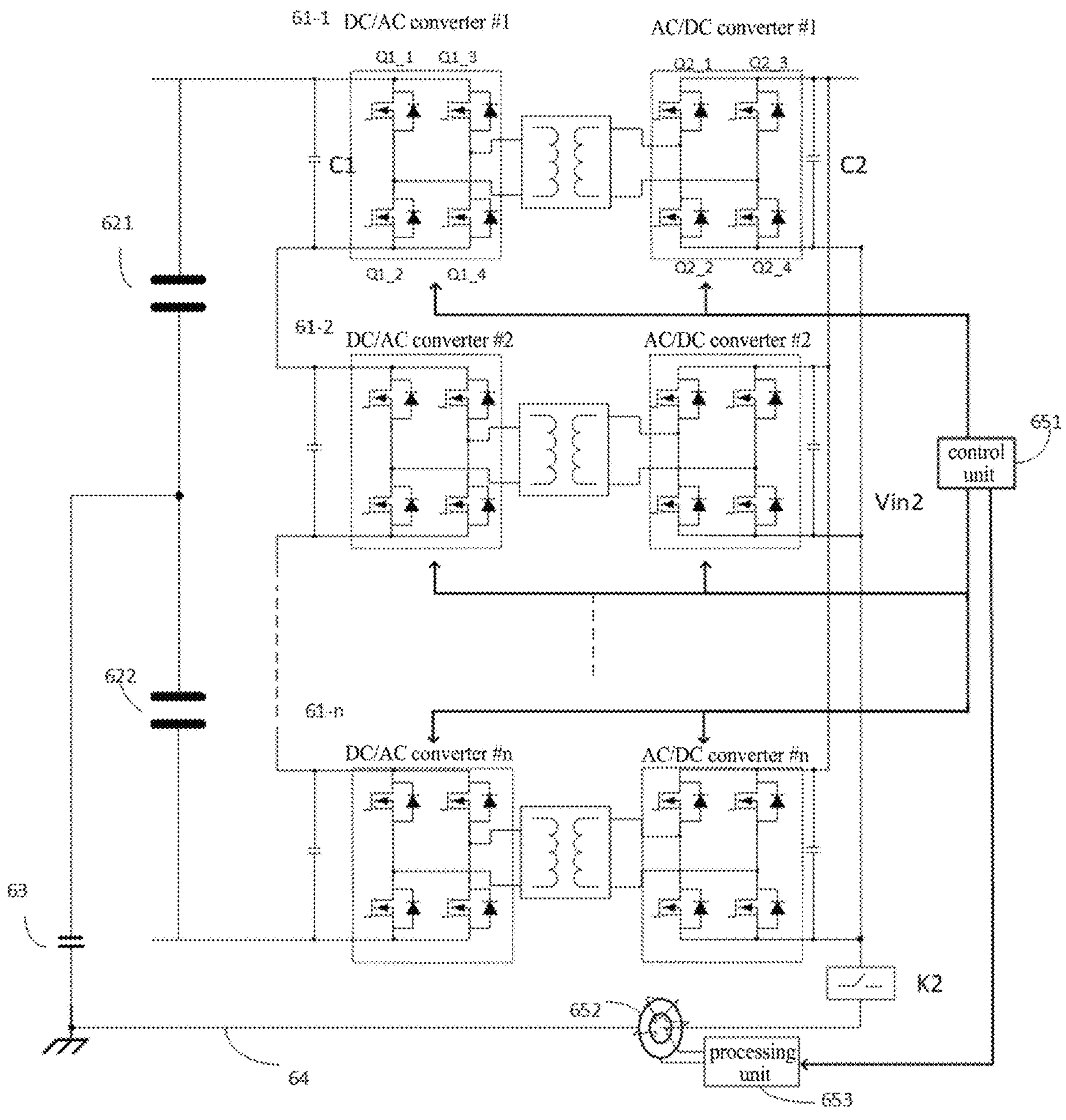

FIGS. 11 and 12 are schematic diagrams of an insulation detection apparatus for a conversion system provided in a fifth embodiment of the application. As shown in FIGS. 11 and 12, the fifth embodiment provides an insulation detection apparatus for a conversion system. As shown in FIG. 11, the conversion system includes a converter module, an excitation source, a coupling impedance network 63 (such as, a capacitor), a connection element 64 and a second controllable switch K2. The converter module includes n conversion units 61-1, 61-2 to 61-*n*, and each conversion unit includes a DC/DC converter, and a first port and a second port. The first port of each conversion unit is connected in parallel to a DC capacitor C1. The first ports of the n conversion units are connected in series, and the second ports are connected in parallel. Each DC/DC converter includes a transformer. The excitation source includes a first capacitor 621 and a second capacitor 622. After being connected in series, the connection element 64, the coupling impedance network 63 and the controllable switch K2 are connected between a midpoint of the first capacitor 621 and the second capacitor 622 and a second terminal of the converter module. The insulation detection apparatus includes a control unit 651, an insulation detection unit 652 and a processing unit 653. The control unit 651, the insulation detection unit 652 and the processing unit 653 are completely the same as that shown in FIG. 4, so the details are not described here.

As shown in FIG. 12, each DC/DC converter includes a DC/AC converter, a transformer and an AC/DC converter electrically connected sequentially. The DC/AC converter is a full bridge, and includes switches Q1_1, Q1_2, Q1_3 and Q1_4. The AC/DC converter is also a full bridge, and includes switches Q2_1, Q2_2, Q2_3 and Q2_4. The control unit 651 controls the switches Q1_1, Q1_3, Q2_1 and Q2_3, or the switches Q1_1, Q1_3, Q2_2 and Q2_4 of each DC/DC converter to turn on, thereby connecting the capacitors in series, reducing an impedance in the insulation detection circuit, and enhancing an intensity of the insulation detection signals.

In some embodiments, it is also possible to reduce the impedance in the insulation detection circuit, and enhance the intensity of the insulation detection signals by turning on the switch Q1_1 or Q1_3 of each DC/AC converter and any one of the switches Q2_1 to Q2_4 of each AC/DC converter.

Figure 13:
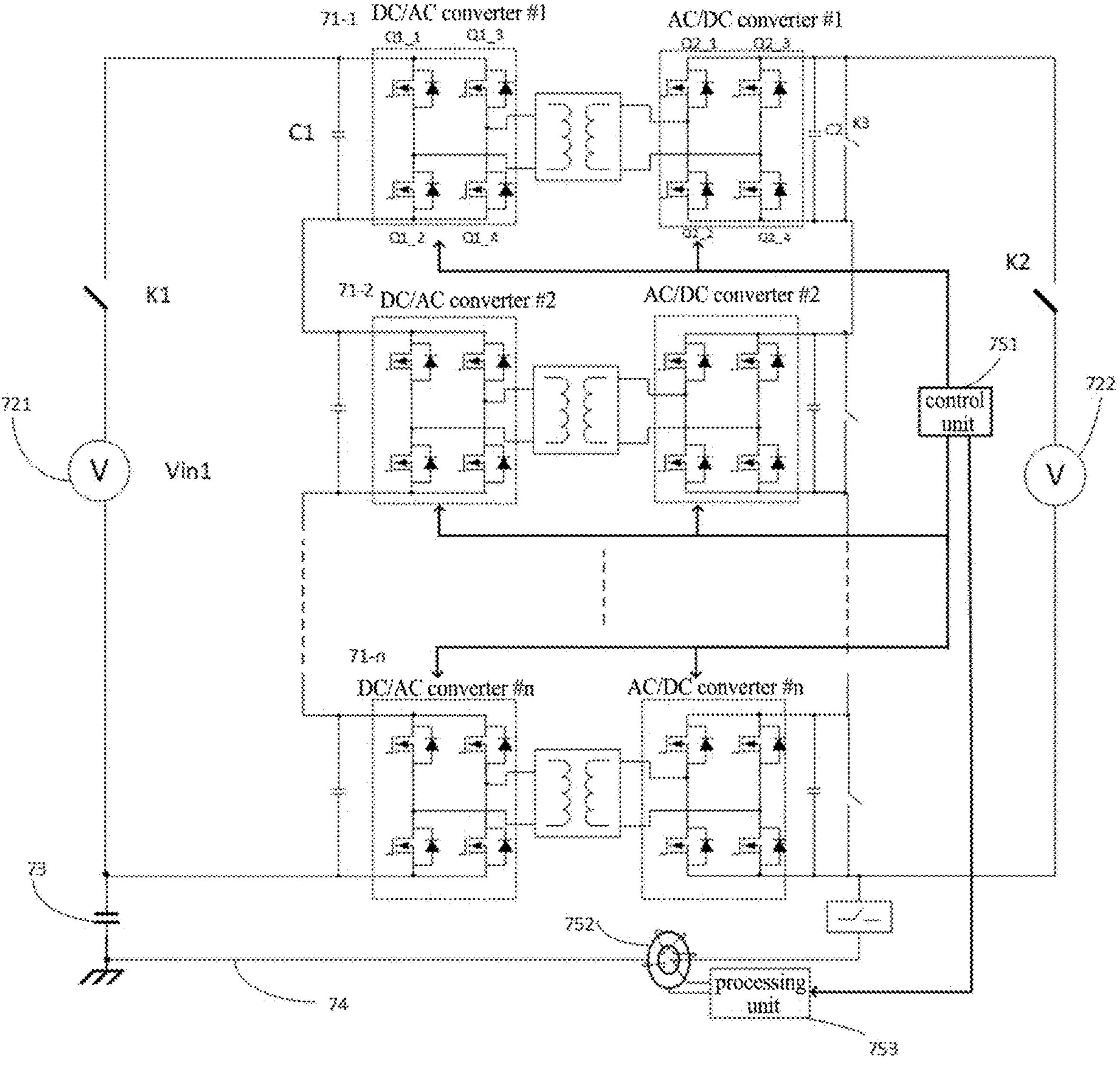
FIG. 13 is a schematic diagram of an insulation detection apparatus for a conversion system provided in a sixth embodiment of the application.

FIG. 13 is a schematic diagram of an insulation detection apparatus for a conversion system provided in a sixth embodiment of the application. As shown in FIG. 13, the sixth embodiment provides an insulation detection apparatus for a conversion system. The conversion system includes a converter module, an excitation source, a coupling impedance network 73 (such as, a capacitor), a connection element 74, a first switch K1 and a second switch K2. The converter module includes n conversion units 71-1, 71-2 to 71-*n*, and each conversion unit includes a DC/DC converter including a DC/AC converter, a transformer and an AC/DC converter electrically connected sequentially. A first port of each conversion unit is connected in parallel with a DC capacitor C1, and a second port of each conversion unit is connected in parallel with a DC capacitor C2 and a bypass switch K3. The first ports of the n conversion units are connected in series, and the second ports are connected in parallel. The excitation source includes a DC power source 721 and a DC power source 722 connected to first ports and second ports of the DC/DC converters, respectively.

A detection method used by the insulation detection apparatus for the conversion system provided in the sixth embodiment of the application includes:

The first ports and the second ports of the DC/DC converters are provided with DC power sources 721 and 722, respectively. The switch K1 is turned on to charge the DC capacitor C1 and K2 is turned off, or the switch K2 is turned on to charge the DC capacitor C2 and K1 is turned off. Then, at least one switch at a charging side is turned on by the control unit 751 to reduce an impedance of the detection circuit. For example, the switch K1 is turned on to charge the DC capacitor C1, K2 is turned off, Q1_1 and Q1_3 of the DC/DC converters are turned on, and the DC/DC converters are controlled to have short circuits at non-charging sides, i.e., turning on Q2_1 and Q2_2 or Q2_3 and Q2_4, thereby reducing the impedance in the detection circuit. In some embodiments, short circuits of the DC/DC converters at the non-charging sides can also be achieved by turning on the switch K3, or switches Q2_1 and Q2_3.

The insulation detection unit 752 detects signals that reflect a current flowing through the connection element 74; and The processing unit 753 processes the signals that reflect a current flowing through the connection element 74 and outputs insulation information, and the insulation information represents an insulation state of the conversion system.

Figure 14:
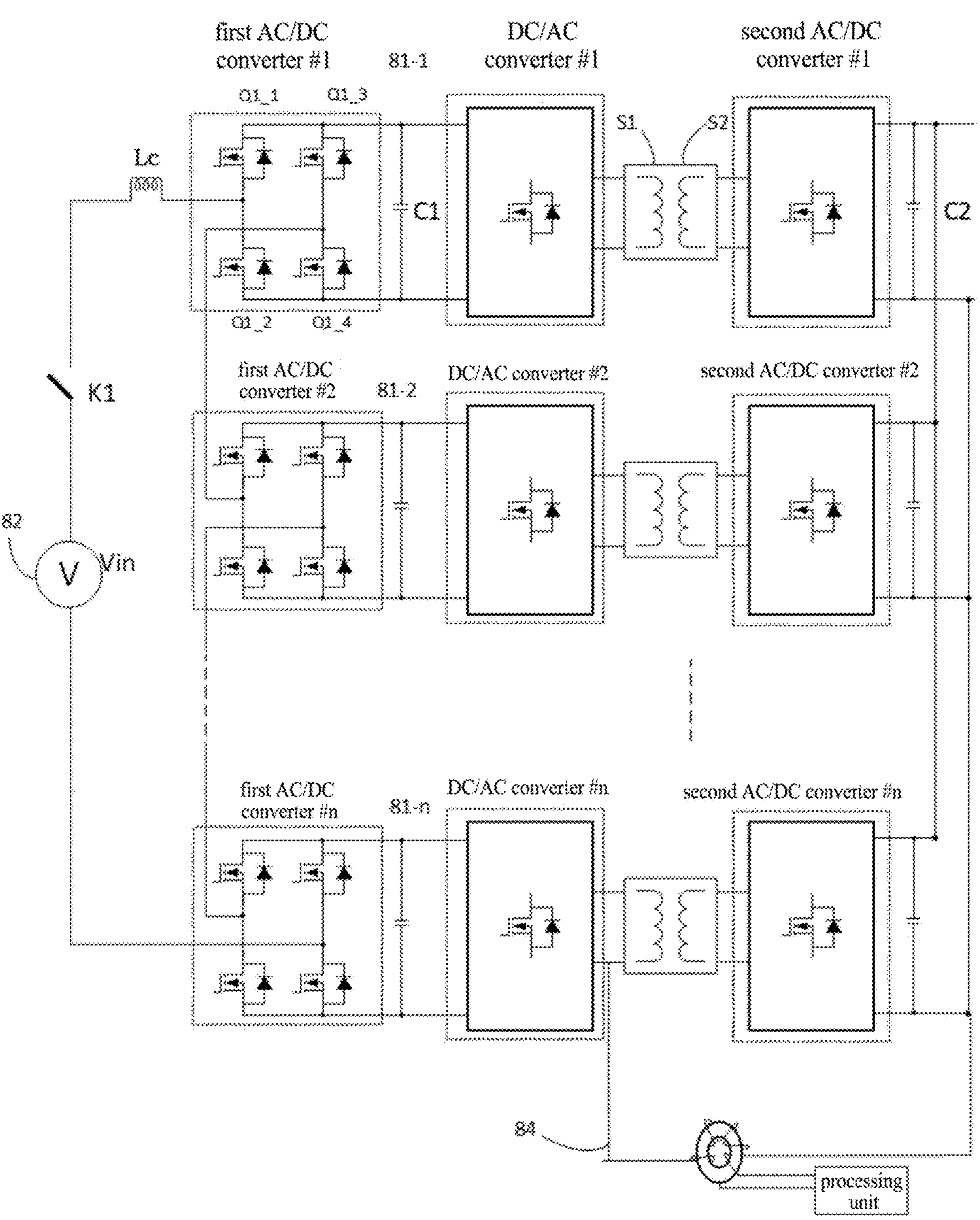
FIG. 14 is a schematic diagram of an insulation detection apparatus for a conversion system provided in a seventh embodiment of the application.

FIG. 14 is a schematic diagram of an insulation detection apparatus for a conversion system provided in a seventh embodiment of the application. As shown in FIG. 14, the sixth embodiment provides an insulation detection apparatus for a conversion system. The conversion system includes a converter module, an excitation source 82 and a connection element 84. The converter module includes n conversion units 81-1 to 81-*n*, each conversion unit includes a transformer including a primary winding S1 and a secondary winding S2, and each conversion unit has a first port and a second port. A first terminal of the connection element 84 is connected to a primary side of the transformer of the conversion unit 81-*n*, and a second terminal of the connection element 84 is connected to the second port of each conversion unit. The insulation detection circuits of the conversion units 81-1 to 81-*n*−1 all include the DC/AC converter of the conversion unit 81-*n*. To form a low impedance insulation detection circuit, an insulation detection method used in this embodiment includes:

Each conversion unit includes a first AC/DC converter (including switches Q1_1 to Q1_4), a DC/AC converter, a transformer and a second AC/DC converter electrically connected sequentially. The DC/AC converter, the transformer and the second AC/DC converter form a DC/DC converter. An input port of the DC/AC converter is connected in parallel to a DC capacitor C1. Q1_1 and Q1_4 of each first AC/DC converter are turned on, such that the capacitors C1 of the n conversion units are connected in series. At least one upper switch of the DC/AC converters of the conversion units 81-1 to 81-*n* is turned on, such that a primary side of the transformer and a high-voltage side of the DC capacitor C1 are equipotential. A lower switch of each second AC/DC converter is turned on, such that a secondary side of the transformer and the second terminal of the connection element 84 are equipotential. A lower switch of the DC/AC converter of the conversion unit 81-*n* is turned on, such that the primary side of the transformer and a low-voltage side of the DC capacitor C1 are equipotential, thereby forming low impedance insulation detection circuits of the conversion units 81-1 to 81-*n*.

Figure 15:
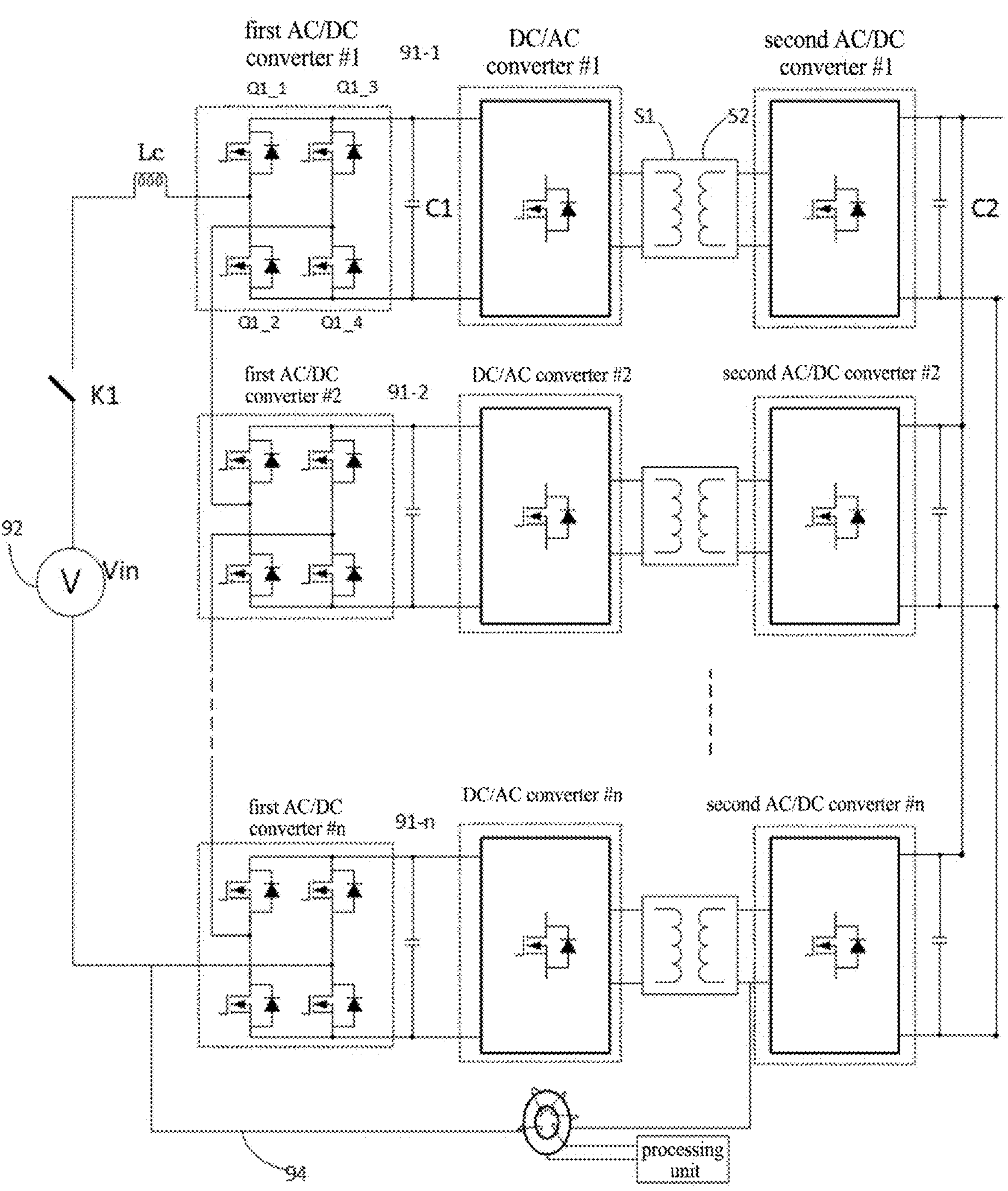
FIG. 15 is a schematic diagram of an insulation detection apparatus for a conversion system provided in an eighth embodiment of the application.

FIG. 15 is a schematic diagram of an insulation detection apparatus for a conversion system provided in an eighth embodiment of the application. As shown in FIG. 15, the eighth embodiment provides an insulation detection apparatus for a conversion system. The conversion system includes a converter module, an excitation source 92 and a connection element 94. The converter module includes n conversion units 91-1 to 91-*n*, each conversion unit includes a transformer including a primary winding S1 and a secondary winding S2, and each conversion unit has a first port and a second port. A first terminal of the connection element 94 is connected to a first port of the converter module, and a second terminal of the connection element 94 is connected to a secondary side of the transformer of the conversion unit 91-*n*. The insulation detection circuits of the conversion units 91-1 to 91-*n* all include a secondary converter of the conversion unit 91-*n*. In order to form the insulation detection circuit with the lowest impedance, an insulation detection method includes:

Each conversion unit includes a first AC/DC converter (including switches Q1_1 to Q1_4), a DC/AC converter, a transformer and a second AC/DC converter electrically connected sequentially. The DC/AC converter, the transformer and the second AC/DC converter form a DC/DC converter. An input port of the DC/AC converter is connected in parallel to a DC capacitor C1. Q1_1 and Q1_4 are turned on, such that the capacitors C1 of the n conversion units are connected in series. At least one upper switch of all DC/AC converters is turned on, such that a primary side of the transformer and a high-voltage side of the DC capacitor C1 are equipotential. Lower switches of all second AC/DC converters are turned on, such that a secondary side of the transformer and the second terminal of the connection element 94 are equipotential. In such way, the conversion units 91-1 to 91-*n* all form low impedance insulation detection circuits.

In some embodiments, the connection element is a low impedance cable or PCB wiring or sheet metal part. In some embodiments, the connection element may include a switch, such as, a converter.

The insulation detection method of the application forms a low impedance insulation detection circuit by turning the switches of the system in the insulation detection system of the medium-high voltage converter, and has the following advantages:

(1) enhancing an intensity of the insulation detection signals, so as to facilitate recognizing the insulation signals;

(2) widely applied to insulation monitoring of the multi-switch cascaded medium-high voltage isolation converter;

(3) easy to implement, and a low cost without adding additional components.

Although the embodiments of the application have been illustrated and described, as for those ordinary in the art, it can be understood that these embodiments can have various changes, modifications, replacements and variations without departing from principle and spirit of the application, and the protection scope of the application is subject to the scope defined by the appended claims.

What is claimed is:

1. An insulation detection method for a conversion system, the conversion system comprising:

a converter module comprising n conversion units, where n≥1, each of the n conversion units comprising a power conversion circuit, the power conversion circuit comprising at least a power switching device and a transformer comprising a primary winding and a secondary winding; and a connection element comprising a first end electrically connected to a first port of the converter module and a second end electrically connected to a second port of the converter module;

the insulation detection method comprising:

turning on at least one power switching device of the converter module to form a low impedance detection circuit via the connection element;

detecting signals that reflect a current flowing through the connection element; and processing the signals and outputting insulation information, wherein the insulation information represents an insulation state of the conversion system.

2. The insulation detection method according to claim 1, wherein the conversion system comprises an excitation source electrically connected to the primary winding of the transformer or connected in series with the connection element, the excitation source comprising at least one of:

a power generating device;

a battery;

a DC power grid;

a capacitor with charge; and a converter module.

3. The insulation detection method according to claim 1, wherein the conversion system further comprises a first controllable switch connected in series with the connection element, and the insulation detection method further comprises:

turning on the first controllable switch.

4. The insulation detection method according to claim 1, wherein the conversion system further comprises a coupling impedance network connected in series with the connection element and comprising at least one of a resistor, an inductor and a capacitor.

5. The insulation detection method according to claim 1, wherein each of the n conversion units comprises a DC/AC converter or a AC/AC converter electrically connected to the primary winding of the transformer, and the at least one switch is in the DC/AC converters or the AC/AC converters of the n conversion units.

6. The insulation detection method according to claim 1, wherein each of the n conversion units comprises a AC/DC converter or a AC/AC converter electrically connected to the secondary winding of the transformer, and the at least one switch is in the AC/DC converters or the AC/AC converters of the n conversion units.

7. The insulation detection method according to claim 1, wherein each of the n conversion units comprises a bridge arm, and the at least one switch is in the bridge arms of the n conversion units.

8. The insulation detection method according to claim 1, wherein each of the n conversion units has a first port and a second port, the first ports of the n conversion units are connected in series or in parallel, and the second ports of the n conversion units are connected in series or in parallel, where n≥2.

9. The insulation detection method according to claim 1, wherein each of the n conversion units has a first port and a second port, and comprises a first bypass switch connected in parallel to the second port, the second ports of the n conversion units are connected in series, where n≥2, and at least one switch of the converter module comprises the first bypass switch.

10. The insulation detection method according to claim 1, wherein the switch is a semiconductor switch or a mechanical switch or a breaker or a contactor or a relay.

11. The insulation detection method according to claim 1, wherein the conversion system further comprises an insulation detection unit for detecting signals that reflect a current flowing through the connection element.

12. An insulation detection apparatus for a conversion system, the conversion system comprising:

a converter module comprising n conversion units, where n≥1, each of the n conversion units comprising a power conversion circuit, the power conversion circuit comprising at least a power switching device and a transformer comprising a primary winding and a secondary winding; and a connection element comprising a first end electrically connected to a first port of the converter module and a second end electrically connected to a second port of the converter module;

the insulation detection apparatus comprising:

a controller connected to the converter module for controlling at least one power switching device of the converter module to be turned on to form a low impedance detection circuit via the connection element;

a first insulation detection unit sleeved onto the connection element and connected to the control unit for detecting signals that reflect a current flowing through the connection element; and a processing circuit connected to the first insulation detection unit for processing the signals and outputting insulation information, wherein the insulation information represents an insulation state of the conversion system.

13. The insulation detection apparatus according to claim 12, wherein the conversion system comprises an excitation source electrically connected to the primary winding of the transformer or connected in series to the connection element, the excitation source comprising at least one of:

a power generating device;

a battery;

a DC power grid;

a capacitor with charge; and a converter module.

14. The insulation detection apparatus according to claim 12, wherein the conversion system further comprises a first controllable switch connected in series with the connection element.

15. The insulation detection apparatus according to claim 12, wherein the conversion system further comprises a coupling impedance network connected in series with the connection element and comprising at least one of a resistor, an inductor and a capacitor.

16. The insulation detection apparatus according to claim 12, wherein each of the n conversion units comprises a DC/AC converter or a AC/AC converter electrically connected to the primary winding of the transformer, and the at least one switch is in the DC/AC converters or the AC/AC converters of the n conversion units.

17. The insulation detection apparatus according to claim 12, wherein each of the n conversion units comprises a AC/DC converter or a AC/AC converter electrically connected to the secondary winding of the transformer, and the at least one switch is in the AC/DC converters or the AC/AC converters of the n conversion units.

18. The insulation detection apparatus according to claim 12, wherein each of the n conversion units comprises a bridge arm, and the at least one switch is in the bridge arms of the n conversion units.

19. The insulation detection apparatus according to claim 12, wherein each of the n conversion units has a first port and a second port, the first ports of the n conversion units are connected in series or in parallel, and the second ports of the n conversion units are connected in series or in parallel, where n≥2.

20. The insulation detection apparatus according to claim 12, wherein each of the n conversion units has a first port and a second port, and comprises a first bypass switch connected in parallel to the second port, the second ports of the n conversion units are connected in series, where n≥2, and at least one switch of the converter module comprises the first bypass switch.

21. The insulation detection apparatus according to claim 12, wherein the switch is a semiconductor switch or a mechanical switch or a breaker or a contactor or a relay.

22. The insulation detection method according to claim 1, wherein the conversion system comprises an excitation source electrically connected to the primary winding of the transformer or connected in series with the connection element, the excitation source comprising at least one of:

a power generating device;
a battery;
an AC power grid; and
a converter module.

23. The insulation detection apparatus according to claim 12, wherein the conversion system comprises an excitation source electrically connected to the primary winding of the transformer or connected in series to the connection element, the excitation source comprising at least one of:

a power generating device;
a battery;
an AC power grid; and
a converter module.

* * * * *